United States Patent
Stomakhin et al.

(10) Patent No.: US 11,455,444 B2
(45) Date of Patent: *Sep. 27, 2022

(54) METHOD FOR GENERATING SIMULATIONS OF FLUID INTERFACES FOR IMPROVED ANIMATION OF FLUID INTERACTIONS

(71) Applicant: Unity Technologies SF, San Francisco, CA (US)

(72) Inventors: Alexey Stomakhin, Waimanalo (NZ); Sven Joel Wretborn, Wellington (NZ); Gilles Daviet, Mûres (FR); Daniel Martin Elliott Jones, Wellington (NZ)

(73) Assignee: Unity Technologies SF, San Francisco, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/523,293

(22) Filed: Nov. 10, 2021

(65) Prior Publication Data

US 2022/0067244 A1 Mar. 3, 2022

Related U.S. Application Data

(63) Continuation of application No. 17/183,993, filed on Feb. 24, 2021, now Pat. No. 11,341,301.
(Continued)

(51) Int. Cl.
*G06F 30/25* (2020.01)
*G06F 30/17* (2020.01)
(52) U.S. Cl.
CPC ............. *G06F 30/25* (2020.01); *G06F 30/17* (2020.01)

(58) Field of Classification Search
CPC ................ G06F 30/25; G06F 30/17
(Continued)

(56) References Cited

U.S. PATENT DOCUMENTS 5,051,213 A * 9/1991 Weske .............. B01F 23/233
261/78.2
7,629,986 B2 * 12/2009 Bobrow .............. G06T 11/206
345/473
(Continued)

OTHER PUBLICATIONS

Stomakhin et al.,(Fluxed Animated Boundary Method, ACM, 2017, pp. 1-8). (Year: 2017).*
(Continued)

*Primary Examiner* — Iftekhar A Khan
(74) *Attorney, Agent, or Firm* — Philip H. Albert; William T. Hoyer McCarthy; Haynes and Boone LLP

(57) ABSTRACT

A method for generating visual representations of interactions between two different materials is provided. The method can be performed using a computing device operated by a computer user or artist. The method includes modeling a primary material as a plurality of first particles and modeling a layer portion of a secondary material as a fluid volume. The secondary material can include a layer portion positioned between the plurality of first particles and an outer portion. At least one boundary condition might be assigned to a boundary positioned between the layer portion and the outer portion, the at least one boundary condition includes at least one pressure value. Values of motion parameters might be determined by applying the at least one boundary condition at the boundary and generating one or more visual representations of the primary material interacting with the secondary material based on the values of the motion parameters.

20 Claims, 7 Drawing Sheets

Related U.S. Application Data

(60) Provisional application No. 62/983,435, filed on Feb. 28, 2020.

(58) Field of Classification Search
USPC .............................................................. 703/2
See application file for complete search history.

(56) References Cited

U.S. PATENT DOCUMENTS

| | | | |
|---|---|---|---|
| 2007/0239409 A1* | 10/2007 | Alan ................. | G06F 30/23 703/2 |
| 2008/0177511 A1* | 7/2008 | Kamatsuchi ........... | G06F 30/20 703/2 |
| 2013/0187930 A1* | 7/2013 | Millman ............... | G06F 30/20 345/473 |
| 2015/0186565 A1* | 7/2015 | Stomakhin .............. | G06F 30/20 703/6 |
| 2016/0140750 A1* | 5/2016 | Pai ......................... | G06T 13/20 345/420 |
| 2016/0267705 A1* | 9/2016 | O'Leary .................. | G06T 1/20 |
| 2019/0035149 A1* | 1/2019 | Chen ...................... | G06T 17/20 |
| 2019/0340318 A1* | 11/2019 | Melchionna .......... | G06T 7/0012 |
| 2019/0378318 A1* | 12/2019 | Roache .................. | G06T 5/002 |
| 2020/0285709 A1* | 9/2020 | Chen ..................... | G06F 30/20 |

OTHER PUBLICATIONS

Erik Gros (Numerical Modelling of Two-Phase Flow with Moving Boundary Fitted Meshes, École Polytechnique Fédérale De Lausanne, 2018, pp. 1-116). (Year: 2018).*

Soderstrom et al. (A PML-Based Nonreflective Boundary for Free Surface Fluid Animation, 2010, ACM, 2010, pp. 1-17) (Year: 2010).*

Bojsen-Hanse et al. (Generalized Non-Reflecting Boundaries for Fluid Re-Simulation, ACM, 2016, pp. 1-7) (Year: 2016).*

Calderer et al. (Level set immersed boundary method for coupled simulation of air/water interaction with complex floating structures, 2014, Elsevier, pp. 201-227) (Year: 2014).*

Gao et al. (An efficient FLIP and shape matching coupled method for fluid-solid and two-phase fluid simulations, 2018, Spriger, pp. 2-14) (Year: 2018).*

Mittal et al. (A Versatile Sharp Interface Immersed Boundary Method for Incompressible Flows With Complex Boundaries, 2008, J Comput Phys, pp. 1-46) (Year: 2008).*

Stomakhin, et al., Fluxed Animated Boundary Method, Trans. Graph.36, 4, Article 68 (Jul. 2017), 8 pages.

Gros, Erik, "Numerical Modelling of Two-Phase Flow with Moving Boundary Fitted Meshes", Ecole Polytechnique Federale De Lausanne, 2018, pp. 1-116) (Year: 2018).

Bojsen-Hansen, Morten et al., "Generalized Non-Reflecting Boundaries for Fluid Re-Simulation", ACM, 2016, pp. 1-7) (Year: 2016).

* cited by examiner

METHOD FOR GENERATING SIMULATIONS OF FLUID INTERFACES FOR IMPROVED ANIMATION OF FLUID INTERACTIONS

CROSS-REFERENCES TO PRIORITY AND RELATED APPLICATIONS

This application is a continuation of U.S. application Ser. No. 17/183,993, filed Feb. 21, 2020, and claims the benefit of U.S. Provisional Application No. 62/983,435 filed Feb. 28, 2020, which is incorporated by reference in its entirety for all purposes.

FIELD OF THE INVENTION

The present disclosure generally relates to simulating interactions between different materials, and more particularly to efficient computational approaches for simulation of interactions between different materials.

BACKGROUND

Visual representations of scenes intended to reflect real-world scenarios are common in animation and other fields. For example, a computer-generated imagery scene could be created by having an artist manually draw a sequence of frames to form a video sequence. For simple cartoons, for example, this is a feasible approach. However, as viewers have come to expect more complex visuals, there is a need for computer-driven imagery generation. Some of that computer-driven imagery generation might rely on simulation.

Computer simulation that is used for imagery generation has been used to animate natural phenomena as well as natural movements of characters, such as by using a physics engine to output movements of an articulated character that are consistent with real-world physics and joint constraints. In some ways, this is often a simple problem—how to determine natural-looking movements of at most a few dozen attached body parts. For other simulations, such as those with flexible objects, fluids, and the like, the number of degrees of freedom of individual units is much greater and typically computer simulation requires a trade-off between realism, resolution, and an amount of computing resources available. Because of this trade-off, efficient computer simulation techniques can be important as they might allow for an increase in realism and/or resolution without requiring significant increases in computing resources. Simulation computations involving bubbles, waterfalls, and other fluid interactions can often involve such trade-offs.

Fluid simulation is ubiquitous in computer graphics. When there is only a single fluid (or gas) of interest, practitioners typically use conventional single-phase fluid simulation tools to determine the fluid's motion. This means the area outside of the fluid is treated as a vacuum. But, multiple fluids are often present and cannot be adequately simulated using conventional single-phase fluid simulation tools. For instance, a waterfall looks significantly different when the water falls through vacuum instead of air. Similarly, an underwater air bubble would collapse if the bubble is represented as a vacuum, which is clearly not case for a real-world air bubble. In these examples, air needs to be accounted for and not modeled as being a vacuum, to achieve the proper look of the interaction between the air and water. As such, this typically involves a two-phase air-water coupled simulation. Unfortunately, such two-phase air-water coupled simulations are typically quite computationally expensive to perform.

Therefore, there is a need for a more efficient approach to performing simulations of interactions between different materials, that can be applicable to, for example, two-phase air-water coupled simulations.

BRIEF DESCRIPTION OF THE DRAWINGS

Various embodiments in accordance with the present disclosure will be described with reference to the drawings, in which.

DETAILED DESCRIPTION

Figure 1:
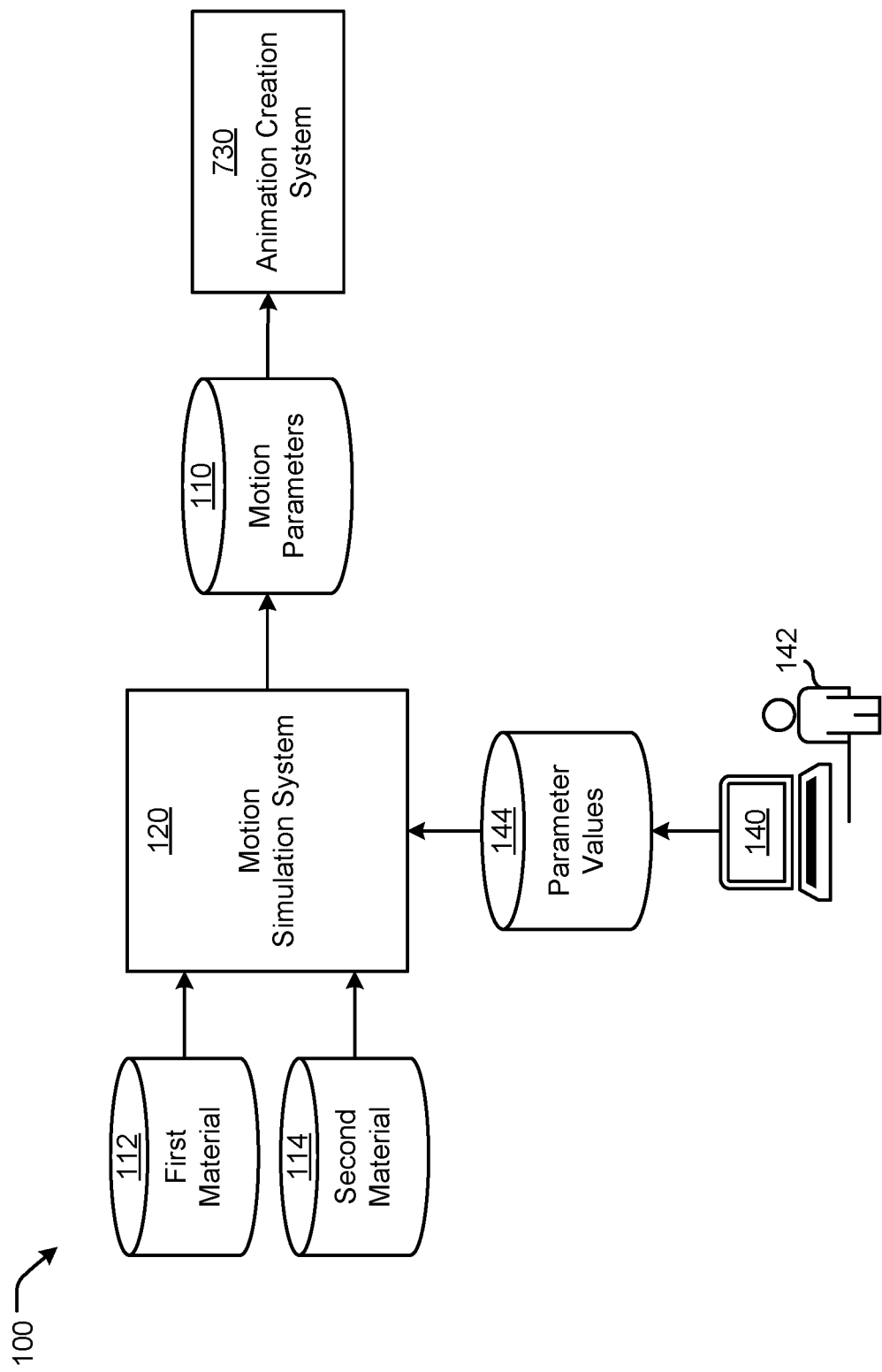
FIG. 1 is a diagram of a data flow through a system when the system is generating values of motion parameters, which are used to create visual representations of a first material interacting with a second material.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

In a computer simulation involving three dimensions and having an output that is imagery (such as a still image or a sequence of video frames), often the virtual objects and material being simulated are represented relative to a three-dimensional ("3D") grid in a virtual space with the grid being divided into voxels. Some elements might have sub-voxel resolution.

In typical computer simulations, it is difficult to achieve realistic looking sceneries that comprise moving objects, e.g., waterfalls and underwater bubbles. Waterfall simulations typically involved dragging water towards a pre-scribed, artistically driven air field. In such simulations, the air affects the water, but the water does not affect the air. Another approach represents the air as a single velocity field, and (partially) applies a divergence-free projection to the single velocity field. This approach gives the appearance that the water has affected the air and may create an interesting flow of air that in turn affects the water. However, it is unclear to what degree such solutions are physics based. Earlier simulation techniques for simulating underwater bubbles include, for example, R. Goldade and C. Batty, Constraint bubbles: Adding efficient zero-density bubbles to incompressible free surface flow, 2017 adopt a particle-in-cell fluid simulator that represents each air pocket as a volume conserving void with fixed pressure. While such technique is capable of recreating realistic gargling water effects, it does not capture subtle bubble detail that makes it fully realistic. By way of another example, L. Boyd and R. Bridson, *Multiflip for energetic two-phase fluid simulation*, ACM Trans. Graph., 31(2), April 2012, use a Fluid Implicit Particle ("FLIP") method to discretize both water and air and perform a two-phase incompressible solve.

On the other hand, bubbles smaller than a grid voxel size are typically represented as a separate particle system. For example, D. Kim, O. Song, and H. Ko, *A practical simulation of dispersed bubble flow*, ACM Trans. Graph., 29(4), July 2010, passively advect those particles with the bulk fluid and use them to adjust effective density of water, leading to naturalistic buoyancy effects. They employ a stochastic solver for additional sub-voxel motion. By way of another example, S. Patkar, M. Aanjaneya, D. Karpman, and R. Fedkiw, *A hybrid lagrangian-eulerian formulation for bubble generation and dynamics*, In Proc. of the ACM SIGGRAPH/Eur. Symp. on Comp. Anim., SCA, pages 105-114, New York, N.Y., USA, 2013, ACM, use an Eulerian two-phase approach for simulating bubbles larger than the grid voxel size and passively advected particles for tracking bubbles smaller than the grid voxel size. Patkar et al. combine the two differently sized groups of bubbles in a single linear solve, which also handles compressibility.

A typical method of simulating bubbles (e.g., primary material 302 of FIG. 3) moving deep under water (e.g., secondary material 304) creates a Fluid Implicit Particle ("FLIP") model of the water and represents the bubbles as constraints. An example of this approach is provided by SideFX Houdini software. This approach concentrates most of the computational resources on the water and preserves its volume. Unfortunately, tracking the bubbles and preserving their volume is a problem because they are not modeled as a full phase. This makes the bubble movement with respect to the water less realistic, which is unfortunate because the bubbles are more visual significant than the water.

Another method of simulating bubbles uses a FLIP model to simulate both the bubbles (e.g., the primary material 302) and the water (e.g., the secondary material 304). An example of this approach is provided by L. Boyd and R. Bridson, *Multiflip for energetic two-phase fluid simulation*, ACM Trans. Graph., 31(2), April 2012. Using this approach, both the water and the bubbles are accurately represented. Unfortunately, this approach is computationally expensive because it fully represents all of the water.

Via various embodiments, more efficient simulation approaches that can provide the same high level of realistic looking interactions between different materials are presented. These efficient simulations are performed without partaking computationally expensive approaches that incur in traditional approaches that fully take into account all of the water.

In many of the examples described herein, inputs to a computer simulation system include parameters about the virtual material/object/fluid/etc. being simulated and an output of a computer simulation are the positions/mass/movement/etc. of the virtual material/object/fluid/etc. Such an output might be an input to an animation system, which can provide for rendering computer-generated imagery of the virtual material/object/fluid/etc. present in a scene in a virtual space. The computer-generated imagery might be still images, stereoscopic images, video sequences, and/or stereoscopic video sequences. In some cases, the computer simulation of virtual elements seeks to match what would happen with corresponding real-world elements, but in other cases, artistic or other inputs are used in the computer simulation to create effects that do not correspond to anything in the real-world, or at least anything in available physical environments. For example, in a given simulation, an operator of a simulation engine might provide an input that corresponds to gravity "turning off" for a short period of time, which can be simulated but has no real-world correspondence.

The primary material may be modeled as a plurality of particles or objects that may, in some cases, be unconstrained relative to one another, such that each object can move independently of the others. This may occur for example with granular media such as droplets or bubbles, and may be thought of as a zero-dimensional constraint, or a constraint on zero degrees of freedom. A one-dimensional constraint, or constraint of a single degree of freedom, may occur for example with hair, wherein the hairs are free to move relative to one another along most of their lengths, but are fixed at one end relative to one another. A two-dimensional constraint or two-degree-of-freedom constraint may for example occur with cloth, wherein the objects of the porous medium are interwoven fibers that are free to move, bend, or fold in three dimensions but have fixed locations relative to one another within the topological plane of the cloth. A three-dimensional constraint or three-degree-of-freedom constraint can occur for example with a three-dimensional network such as a sponge, wherein the objects of the porous medium are fibers or other shapes that intertwine in three dimensions. A sponge may be capable of bending or flexing, but the objects making up the sponge may have fixed spatial relationships to one another within the topological volume of the sponge. In some cases, coupling or constraint between two fluid objects, or objects within a fluid, may occur through surface tension.

FIG. 1 is a diagram of a data flow through a system 100 when the system 100 is configured to perform a process 200 (see FIG. 2) that generates values of motion parameters 110. The motion parameters 110 are used by an animation creation system 630, which is a component of an example visual content generation system 600 (see FIG. 6), to create visual representations of interactions between first material 112 and second material 114. For example, the system 100 may be used to simulate one or more bubbles of the first material 112 positioned inside (e.g., floating within) the second material 114. The first material 112 and the second material 114 are different materials and each may represent a gas, a combination of gases (e.g., air), a liquid, another fluid, or a combination of fluids. Additionally, the first material 112 and the second material 114 may include solid particles held in suspension or floating therein.

In some embodiments, the first material 112 and the second material 114 may be configured to remain separate, at least temporarily, when mixed together. By way of a non-limiting example, the first material 112 may be air and the second material 114 may be water, or vice versa. When one of the first material 112 and the second material 114 is a gas and the other is a liquid, the system 100 may be characterized as simulating interactions between multiple phases of matter, namely gas and liquid phases. The system 100 may also be used to simulate the first material 112 and the second material 114 in the same phase. For example, one of the first material 112 and the second material 114 may be a polar fluid (e.g., water) and the other may be a non-polar fluid (e.g., oil).

Referring to FIG. 1, the system 100 as shown includes a motion simulation system 120 and at least one client computing device 140 operated by at least one human artist 142. The motion simulation system 120 may be implemented by software executing on one or more computer systems (e.g., each like a computer system 700 illustrated in FIG. 7). The motion simulation system 120 is configured to receive data defining the first material 112 and data defining the second material 114, which are used to output the values of the motion parameters 110. The motion simulation system 120 may be implemented as a fluid simulator (e.g., a particle-in-cell fluid simulator) configured to strongly couple the first material 112 and the second material 114 together by solving a set of equations for the first material 112 and the second material 114 at the same time. For example, the motion simulation system 120 may be configured to perform a two-phase pressure solve on the first material 112 and the second material 114 at the same time. The values of the motion parameters 110 may include the solution obtained for the set of equations. The two-phase pressure solve may be an incompressible two-phase Navier-Stokes solve on an Eulerian grid (also referred to as a two-phase incompressible ghost-fluid Eulerian solve). Alternatively, and/or additionally, the motion simulation system 120 may be configured to weakly or iteratively couple the first material 112 and the second material 114 together by separately solving a first set of equations for the first material 112 and a second set of equations for the second material 114. The values of the motion parameters 110 may include the solutions obtained for the first and second sets of equations. After one of the first and second sets of equations is solved, the solution may be supplied to the other set of equations. Further, as explained below, the motion simulation system 120 may be configured to weakly or iteratively couple the solutions together (e.g., with a drag force 404 illustrated in FIG. 4).

The values of the motion parameters 110 may include the data defining the first material 112 and the data defining the second material 114. The values of the motion parameters 110 may be generated based at least in part on parameter values 144 that may include parameter values defined by the artist 142 (e.g., using the client computing device 140) and/or parameter values that are predetermined and stored in a data store. When the parameter values 144 include user-defined parameter values, the motion of the first material 112 and/or the second material 114 may be characterized as being at least partially art directable.

As described below, the visual content generation system 600 (see FIG. 6) is configured to receive the values of the motion parameters 110 as input, and output one or more static images and/or one or more animated videos. The static image(s) and/or the animated video(s) include one or more visual representations of the first material 112 and/or the second material 114. The visual content generation system 600 may transmit the static image(s) and/or the animated video(s) to the client computing device 140 for display to the artist 142. The artist 142 may use the static image(s) and/or the animated video(s) to view the visual representations of the first material 112 and/or the second material 114 and may make further adjustments to the parameter values 144. Then, the motion simulation system 120 may output new values of the motion parameters 110, which the visual content generation system 600 may use to output new versions of the static image(s) and/or the animated video(s) that may be viewed by the artist 142 on the client computing device 140, or an external computing device (not shown). This process may be repeated until the artist 142 is satisfied with the appearance of the first material 112 and/or the second material 114.

As disclosed above, the client computing device 140 is configured to communicate with the motion simulation system 120. For example, the artist 142 may use the client computing device 140 to specify the parameter values 144 to the motion simulation system 120. Optionally, the motion simulation system 120 may be configured to display the first material 112 and/or the second material 114 to the artist 142 on the client computing device 140 so that the artist 142 may adjust the parameter values 144 as desired before the values of the motion parameters 110 are input into the visual content generation system 600 (see FIG. 6). As described above, the client computing device 140 is configured to receive the static image(s) and/or the animated video(s) from the visual content generation system 600 (see FIG. 5) and display the static image(s) and/or the animated video(s) to the artist 142 so that the artist 142 may adjust the parameter values 144. The client computing device 140 may be implemented using the computer system 700 illustrated in FIG. 7.

Figure 3:
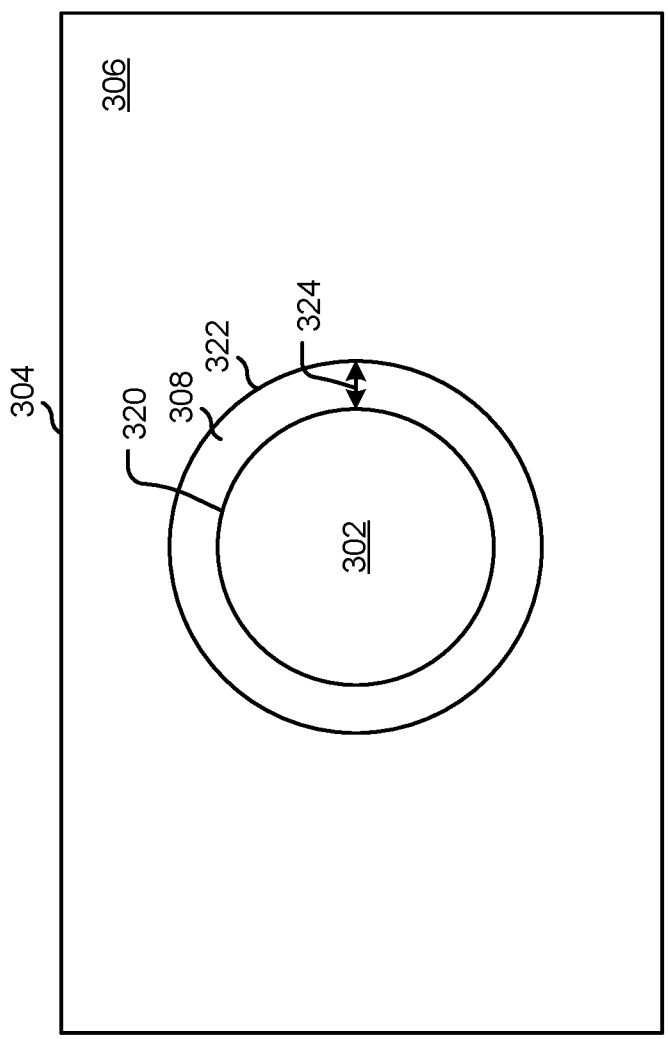
FIG. 3 illustrates a primary material surrounded by a secondary material.

Referring to FIG. 3, one of the first material 112 and/or the second material 114 is selected (e.g., by the artist 142 and/or the motion simulation system 120) as a primary material 302, making the other a secondary material 304. In FIG. 3, for ease of illustration, the primary material 302 (e.g., air) is illustrated as forming a bubble (e.g., particle) inside the secondary material 304 (e.g., water). The secondary material 304 may be considered generally invisible with respect to the primary material 302. For example, when observing bubbles moving in water, the water may be generally invisible with respect to the bubbles but, the water does influence the motion of the bubbles. Similarly, when observing a waterfall (not shown), the air may be generally invisible with respect to the water but, the air does influence the motion of the water. Thus, while some processes might treat the secondary material 304 as being less visually significant than the primary material 302, the secondary material 304 is physically significant and affects the movement of the primary material 302.

By way of a non-limiting example, the process 200 (see FIG. 2) may be used to simulate a bubble of the primary material 302 at least partially submerged inside the secondary material 304. The process 200 (see FIG. 2) may be less computationally expensive than traditional methods because the process 200 does not model an entire volume of the secondary material 304 as a liquid or gas. In some embodiments, the process 200 (see FIG. 2) models a band or a layer portion 308 of the secondary material 304 as a liquid or gas and, in doing so, treats an outer portion 306 of the secondary material 304 as if the dynamics of the outer portion 306 are prescribed. The outer portion 306 includes a region of the secondary material 304 that is too far away from the primary material 302 to affect the movement of the primary material 302 or to be moved by the primary material 302. Thus, the outer portion 306 may be conceptualized and/or modeled as having prescribed dynamics. In some embodiments, the outer portion 306 can be modeled as if the interaction between the primary material 302 and the layer portion 308 does not have any effect on the outer portion 206. Consequently, the outer portion 306 does not move as a result of interaction with the primary material 302. In this instance, the outer portion 306 of the secondary material 304 is not included in the simulation, thus enabling efficient simulation of the overall scene by not computing the outer portion 306 in the simulation. On the other hand, the layer portion 308 that surrounds at least a portion of the primary material 302 affects the movement of the primary material 302, and thus included in the simulation because the layer portion 308 is directly affected by the movement of the primary material 302. However, the secondary material 304 (e.g., water) may have a density that is much larger (e.g., 1000 or 10000 times) than the density of the primary material 302 (e.g., air bubbles). Thus, the secondary material 304 may exert greater force on the primary material 302 (e.g., pushing the primary material 302 around) than the primary material 302 may exert on the secondary material 304.

The motion simulation system 120 (see FIG. 1) may represent the secondary material 304 as a sparsely modeled outer volume of fluid and a closely modeled layer portion 308. Since the representation of the outer portion secondary material 304 is sparse (e.g., modeled with a zero or constant velocity), the entire volume of the secondary material 304 is not modeled as a gas, liquid, or other fluid (e.g., with FLIP or Affine Particle in Cell ("APIC") particles). In other words, instead of modeling the entire surrounding volume per se (e.g., a pool) as a fluid, only the layer portion 308 and the primary material 302 need to be considered when solving for the movement of the primary material 302 and the secondary material 304. Thus, the process 200 allows the motion simulation system 120 (see FIG. 1) to solve a single set of equations including both the layer portion 308 and the primary material 302 at the same time to obtain the values of the motion parameters 110 (see FIG. 1) more efficiently than prior art methods.

Figure 2:
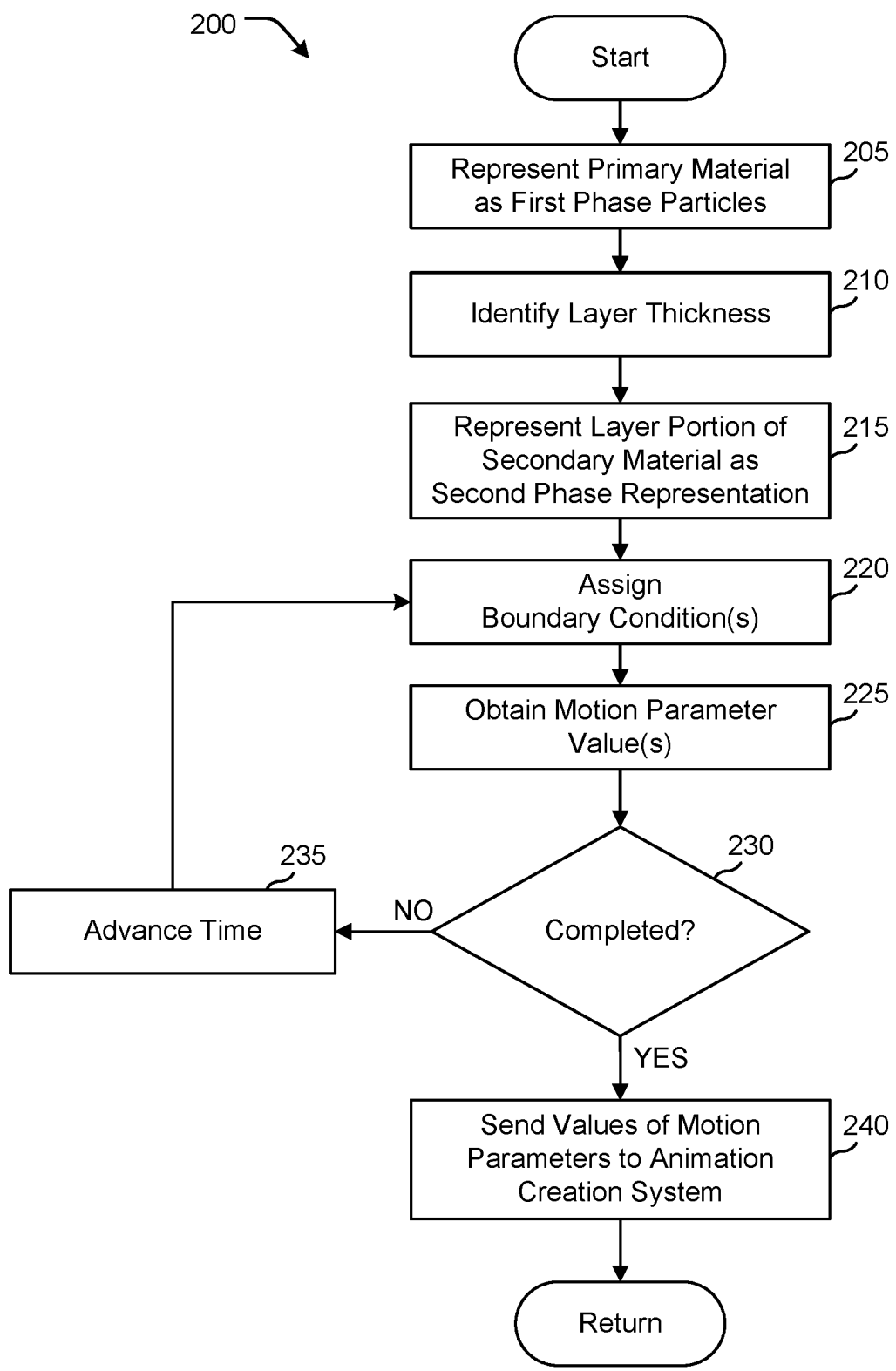
FIG. 2 is a flowchart of the process of generating the values of the motion parameters.

FIG. 2 is a flowchart of the process 200 that may be executed by the system 100 of FIG. 1 and used to generate the values of those of the motion parameters 110 that govern the motion of the primary material 302 and the layer portion 308 of the secondary material 304 (see FIG. 3). Referring to FIG. 2, in first block 205, the motion simulation system 120 (see FIG. 1) represents the primary material 302 (e.g., air) as a plurality of first phase particles (e.g., FLIP or APIC particles). The first phase particles may be implemented as Lagrangian particles. Each of the first phase particles has an initial position (e.g., with respect to an Eulerian grid). By representing the primary material 302 with the first phase particles, the motion simulation system 120 (see FIG. 1) may track the first phase particles, which provide satisfactory accuracy for tracking and ensure volume conservation.

In block 210, the motion simulation system 120 identifies a thickness 324 of the layer portion 308. Both the layer portion 308 and the thickness 324 are defined between first and second boundaries 320 and 322. The first boundary 320 is an interface between the layer portion 308 and the primary material 302. The second boundary 322 is an outer surface of the layer portion 308 and may be characterized as being an interface between the layer portion 308 and the outer portion 306. In some embodiments, the thickness 324 of the layer portion 308 can be proportional to the size (e.g., diameter) of the bubble or particle of the primary material 302. In some embodiments, the thickness 324 can be about 0.1 to about 10000 times the size (or average size if there are a plurality of bubbles or particles) of the bubble or particle of the primary material 302. For example, the thickness 324 can be about 0.1, 0.2, 0.5, 0.7, 0.8, 1, 2, 5, 10, 15, 20, 25, 50, 100, 200, 500, 1000, 2000, 5000, or 10000 times, inclusive of a range between any two sizes listed therein, of the size (or average size of bubbles or particles) of the bubble or particle of the primary material 302. In some embodiments, the thickness 324 can be between about 0.1 and 10000 times, between about 10 and 1000 times, or between about 1 and 100 times, of the size (or average size of bubbles or particles) of the bubble or particle of the primary material 302. In various embodiments, a thickness 324 or volume of the layer portion 308 may depend on the density of the secondary material 304, the difference in the densities between the primary material 302 and the secondary material 304, the temperature, humidity, pressure, etc. of the environment, or the like.

In accordance with various embodiments, the thicker that the layer portion 308 is, the closer the simulation results are to being physically accurate, with a thinner layer portion leading to dampening effects. Therefore, in some embodiments, the thickness 324 of the layer portion 308 represents a trade-off and may be determined by the artist 142 (see FIG. 1). In some embodiments, the parameter values 144 (see FIG. 1) may include the thickness 324.

Then, in block 215 (see FIG. 2), the motion simulation system 120 (see FIG. 1) represents the layer portion 308 as a second phase representation. The second phase representation may be a sparse Eulerian volume. Thus, the secondary material 304 may be reduced to a sparse Eulerian volume including only the layer portion 308. The second phase representation may include a plurality of voxels (e.g., Eulerian voxels arranged in an Eulerian grid). One or more attribute (e.g., velocity) may be associated with each voxel. The motion simulation system 120 (see FIG. 1) may disregard compressibility of the primary material 302 and the secondary material 304 for efficiency reasons. In other words, the motion simulation system 120 (see FIG. 1) may model both of the primary material 302 and the secondary material 304 as incompressible.

In block 220, the motion simulation system 120 assigns one or more boundary conditions to the first boundary 320 and/or the second boundary 322. For example, when the motion simulation system 120 is simulating a bubble of the primary material 302 (e.g., air) positioned inside the secondary material 304 (e.g., water), the motion simulation system 120 may assign a pressure boundary condition to each point along the second boundary 322. The motion simulation system 120 uses the second boundary 322 to enforce the pressure boundary condition(s), which model the prescribed dynamics of the outer portion 306 on the second boundary 322. For example, the motion simulation system 120 may enforce a pressure boundary condition at each point along the second boundary 322. The motion simulation system 120 may enforce different pressure boundary conditions at different points along the second boundary 322. Alternatively, the motion simulation system 120 may enforce the same pressure boundary condition at all of the points along the second boundary 322. The pressure boundary condition(s) is/are assigned to the second boundary 322 independently of the type of coupling (e.g., weak/iterative, strong, and the like) used by the motion simulation system 120.

The pressure boundary condition(s) may include hydrostatic pressure values. For example, the pressure boundary condition(s) may be implemented as a hydrostatic pressure field that samples a hydrostatic pressure value for each position in the simulation. The hydrostatic pressure values may be calculated using Equation 1 below, in which a variable "h" represents an evaluation height, a variable "$\rho_w$" represents the density of the secondary material 304, and a variable "g" represents the acceleration of gravity.

$$p\_hydrostatic(h) = \rho_w g h \qquad \text{(Eqn. 1)}$$

When the motion simulation system 120 enforces the pressure boundary condition(s) (which may be hydrostatic), as opposed to modeling the outer portion 306 as a solid, an apparent sliding effect of the primary material 302 may be reduced. By using the pressure boundary condition(s) (e.g., the hydrostatic pressure values), the motion simulation system 120 might also avoid null-modes in a Poisson pressure solve when the Poisson pressure solve is used.

By way of a non-limiting example, the motion simulation system 120 may use the hydrostatic pressure values to produce convincing rising bubble effects. As the layer portion 308 (e.g., water) moves around the primary material 302 (e.g., the bubble), the hydrostatic pressure values at the second boundary 322 push on the primary material 302 and the layer portion 308 (e.g., pushing the primary material 302 and the layer portion 308 upwardly).

The pressure boundary condition(s) may be characterized as representing the physical effects of the entire outer portion 306 on the primary material 302 and the layer portion 308. In other words, the pressure boundary condition(s) act as an invisible force that affects (e.g., holds up, shapes, etc.) the primary material 302 and the layer portion 308.

Traditional simulations may produce a pressure field for the secondary material 304. When such pressure field includes the primary material 302 (e.g., bubbles) embedded in the secondary material 304, the pressure field may be used to determine the pressure boundary condition(s) in traditional simulations. For example, the hydrostatic pressure values along the second boundary 322 may be calculated from those pressures outside the second boundary 322.

After the motion simulation system 120 enforces the pressure boundary condition(s) on the second boundary 322, the primary material 302 and the layer portion 308 form a closed system. Because the representation of the secondary material 304 is sparse, the motion simulation system 120 (see FIG. 1) may focus computational resources on those components that are important to the simulation, namely, the primary material 302 (e.g., bubbles) and the layer portion 308. This may allow the system 100 to achieve never-before seen simulation detail.

In block 225, the motion simulation system 120 obtains the values of the motion parameters 110. To obtain the values of the motion parameters 110 the motion simulation system 120 strongly or weakly couples the layer portion 308 and the primary material 302 together. When the motion simulation system 120 (see FIG. 1) solves a single set of equations including both the layer portion 308 and the primary material 302 at the same time to obtain the values of the motion parameters 110 (see FIG. 1), the motion simulation system 120 (see FIG. 1) strongly couples the layer portion 308 and the primary material 302 together. When the motion simulation system 120 (see FIG. 1) uses strong coupling, the first boundary 320 is treated in a standard two-phase Eulerian Navier-Stokes way. For example, the motion simulation system 120 (see FIG. 1) may enforce pressure jump and velocity continuity conditions. In some implementations, strong coupling may be computationally expensive because of the simultaneous solve for the layer portion 308 and the primary material 302. Therefore, in some cases, the motion simulation system 120 may weakly couple the layer portion 308 and the primary material 302 together, which is less accurate but also less computationally expensive.

When the motion simulation system 120 (see FIG. 1) uses weak coupling (e.g., see Waterfall embodiment described below), the primary and secondary materials 302 and 304 are modeled separately. In other words, the motion simulation system 120 alternates between solving for the layer portion 308 and solving for the primary material 302 separately. While alternating, the motion simulation system 120 performs an explicit interactions exchange (e.g., a drag force exchange 400 illustrated in FIG. 4).

The values of the motion parameters 110 may include at least one velocity field, which indicates how the primary material 302 and the layer portion 308 move with respect to their current positions. For example, the motion simulation system 120 may obtain a first velocity field for the primary material 302 (represented by the first phase particles) and a second velocity field for the layer portion 308 (represented by the second phase representation). Each velocity field may include a vector for each position in the simulation (e.g., the Eulerian grid) that indicates how the environment effects the motion (e.g., direction and speed) of a portion of the material currently in that position.

The motion simulation system 120 may calculate new material states for the first phase particles as well as new material states for the second phase representation. The new material states of the first phase particles may include positions and attributes of the first phase particles. The new positions may be based at least in part on the current positions of the first phase particles and the first velocity field. At least some of the new positions may be modified (e.g., by the motion simulation system 120), if necessary, using additional processing known in the art. The new material states of the second phase representation may include states of the Eulerian voxels (in the Eulerian grid) and may be based at least in part on the second velocity field. The new material states of the first phase particles and the second phase representation may be included in the values of the motion parameters 110.

The motion simulation system 120 may identify new locations for the first and second boundaries 320 and 322 (see FIG. 3) based at least in part on the new material states (e.g., new positions) for the first phase particles. Additionally, the motion simulation system 120 may determine new pressure boundary condition(s) (e.g., an updated hydrostatic pressure field) based at least in part on the new location of the second boundary 322. For example, the motion simulation system 120 may calculate the new pressure boundary condition(s) using Equation 1 above. The values of the motion parameters 110 may include the new locations of the first and second boundaries 320 and 322 (see FIG. 3).

Figure 4:
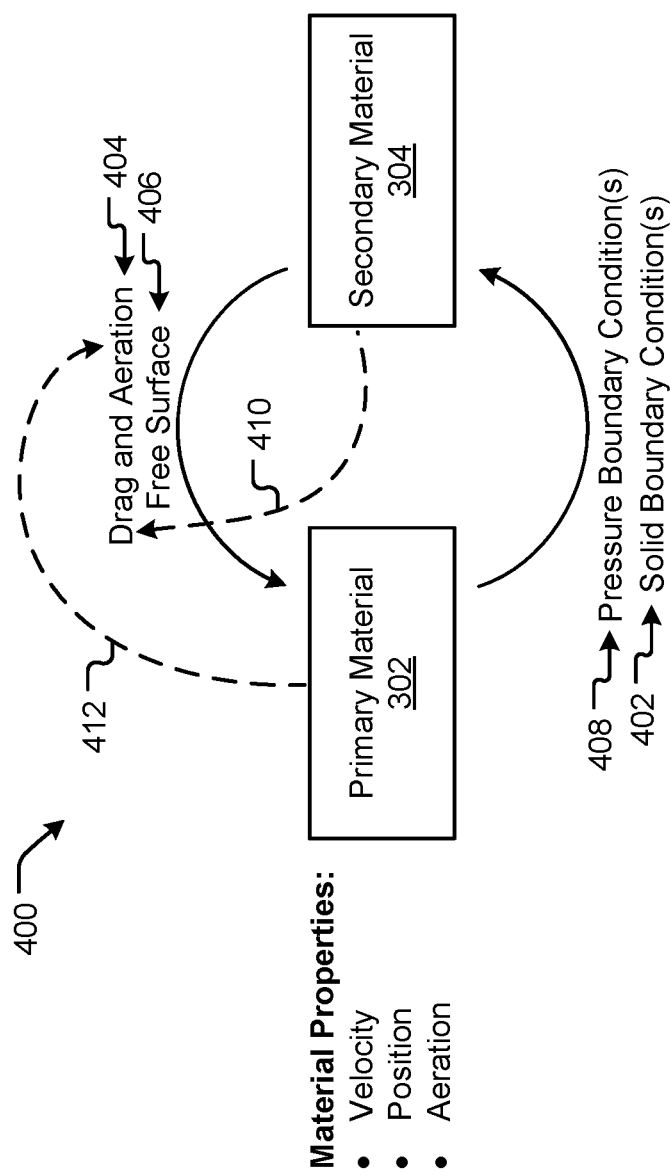
FIG. 4 illustrates a drag force exchange that may be used to couple the primary material and the secondary material together after a first set of equations has been solved for the primary material and a second set of equations has been solved separately for the secondary material.

Referring to FIG. 3, the type of solve performed by the motion simulation system 120 in block 225 may depend on the type of coupling needed to achieve a satisfactory visual result. For example, if the visual result that is achievable by weak coupling is satisfactory, the motion simulation system 120 may perform separate solves for the primary material 302 and the layer portion 308 and couple these solutions together (e.g., as illustrated in FIG. 4). On the other hand, if the visual result that is achievable with weak coupling is unsatisfactory, the motion simulation system 120 may perform a two-phase pressure solve that solves for the primary material 302 and the layer portion 308 at the same time and strongly couples the primary material 302 and the layer portion 308 together. The two-phase pressure solve may include an incompressible two-phase Navier-Stokes solve on an Eulerian grid (also referred to as a two-phase incompressible ghost-fluid Eulerian solve). Methods of performing two-phase pressure solves are known in the art and need not be described in detail.

As explained above, the primary material 302 (e.g., an air phase) is represented as the first phase particles, which facilitates volume conservation and accurate tracking of the new locations of the first boundary 320 (see FIG. 3) and/or the second boundary 322 (see FIG. 3). Thus, unlike the method described in Boyd et al., the motion simulation system 120 tracks the first phase particles and recovers the new locations of the first boundary 320 (see FIG. 3) and/or the second boundary 322 (see FIG. 3).

In decision block 230, the motion simulation system 120 determines whether the simulation has completed. The decision in decision block 230 is "YES," when the motion simulation system 120 determines the simulation has completed. Otherwise, the decision in decision block 230 is "NO." By way of a non-limiting example, blocks 220-235 may be repeated a desired number of iterations (e.g., five times). The number of iterations might be specified by an artist (e.g., the artist 142) or operator in advance. For example, blocks 220-235 may be repeated a number of times required to generate the values of the motion parameters 110 needed to create a desired number of frames.

When the decision in decision block 230 is "NO," the motion simulation system 120 advances to block 235 whereat the motion simulation system 120 advances the simulation in time. Then, the motion simulation system 120 returns to block 220 and assigns the new pressure boundary condition(s) to the second boundary 322 (see FIG. 3).

When the decision in decision block 230 is "YES," in block 240, the motion simulation system 120 forwards the values of the motion parameters 110 to an animation creation system, such as the animation creation system 630 (see FIGS. 1 and 6), which is a component of the visual content generation system 600 (see FIG. 6), which uses the values of the motion parameters 110 to create visual representations of the first material 112 and/or the second material 114. Then, the process 200 terminates.

By way of a non-limiting example, the process 200 may be used to simulate a waterfall. In this example, referring to FIG. 3, the primary material 302 is water, water particles, droplets, or mists. The secondary material 304 is air that surrounds the water, water particles, droplets, or mists.

As described above, in block 205 (see FIG. 2), the motion simulation system 120 (see FIG. 1) represents the primary material 302 (e.g., water) as the first phase particles (e.g., FLIP or APIC particles) each having an initial position (e.g., with respect to an Eulerian grid).

Then, in block 210 (see FIG. 2), the motion simulation system 120 identifies the thickness 324 of the layer portion 308.

Next, in block 215 (see FIG. 2), the motion simulation system 120 (see FIG. 1) represents the layer portion 308 as the second phase representation. The second phase representation may be a sparse Eulerian volume. Thus, the motion simulation system 120 (see FIG. 1) may represent the secondary material 304 as a sparse Eulerian volume of fluid that includes only the layer portion 308.

In block 220 (see FIG. 2), the motion simulation system 120 (see FIG. 1) assigns boundary condition(s) to the first and second boundaries 320 and 322. When solving the first set of equations for the primary material 302, the motion simulation system 120 applies a free surface boundary condition 406 on the first boundary 320 and the drag force 404 in the vicinity of and/or on the second boundary 322. Together, the free surface boundary condition 406 and the drag force 404 model the layer portion 308 as having one or more prescribed velocities. In other words, the motion simulation system 120 assumes the velocity of the layer portion 308 is prescribed. As described below, the motion simulation system 120 may define the drag force 404 based on the velocity of the layer portion 308 (e.g., stored in a second velocity field) and aeration values (described below). When solving the second set of equations for the layer portion 308, the motion simulation system 120 applies the pressure boundary condition(s) discussed above on the second boundary 322 and one or more solid boundary conditions 402 (see FIG. 4) on the first boundary 320. In FIG. 4, the pressure boundary condition(s) are illustrated as pressure boundary condition(s) 408. The motion simulation system 120 assumes the velocity of the primary material 302 is prescribed (e.g., by using the most recently calculated first velocity field 504 illustrated in FIG. 5). As described below, the motion simulation system 120 determines the solid boundary condition(s) 402 based on the velocity of the primary material 302 (e.g., stored in the first velocity field 504). The solid boundary condition(s) 402 and the pressure boundary condition(s) 408 may be characterized as being "hard constraints" on velocity and pressure, respectively. The motion simulation system 120 applies the solid boundary condition(s) 402 and the pressure boundary condition(s) 408 at the first and second boundaries 320 and 322, respectively, while solving the second set of equations.

In block 225 (see FIG. 2), the motion simulation system 120 solves the first set of equations for the primary material 302 to obtain the first velocity field 504 (see FIG. 5), and the second set of equations for the secondary material 304 to obtain the second velocity field (not shown), separately. For each position being simulated (e.g., each position of the Eulerian grid), the first velocity field 504 (see FIG. 5) stores a velocity value (e.g., a vector) that indicates how the environment affects the motion (e.g., direction and speed) of the first phase particle, if any, currently in that position. For each position being simulated (e.g., each position of the Eulerian grid), the second velocity field (not shown) stores a velocity value (e.g., a vector) that indicates how the environment effects the motion (e.g., direction and speed) of a portion (e.g., a voxel) of the second phase representation, if any, currently in that position. After the first set of equations is solved, the solution may be supplied to the second set of equations and used to obtain the second velocity field (not shown). When the motion simulation system 120 next solves the first set of equations to obtain a new first velocity field 510, the motion simulation system 120 performs the drag force exchange 400, which weakly couples the primary material 302 and the layer portion 308 together.

Figure 5:
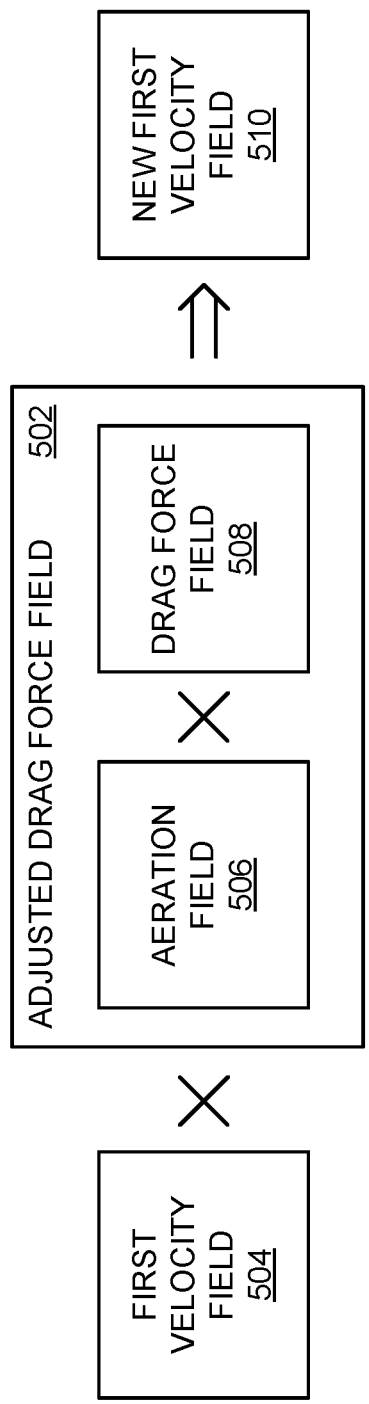
FIG. 5 illustrates a method of calculating a new velocity field as a function of a previous velocity field, an aeration field, and a drag force field.

For example, the motion simulation system 120 (see FIG. 1) may begin by first solving the first set of equations for the primary material 302 to obtain the first velocity field 504 (see FIG. 5). When the motion simulation system 120 (see FIG. 1) solves the first set of equations, the motion simulation system 120 applies the free surface boundary condition 406 at each point along the first boundary 320 and the drag force 404 in the vicinity of or at each point along the second boundary 322, which models the influence of the layer portion 308 (e.g., air) on the primary material 302 (e.g., water). A free surface is a fluid surface that is subject to a prescribed pressure condition. For example, the prescribed pressure condition may be zero if the secondary material 304 (e.g., air) is significantly lighter than the primary material 302 (e.g., water). Methods of calculating the free surface boundary condition 406 are well-known and will not described herein. The drag force 404 may be computed based on the aeration values and drag force values, which are determined based at least in part on the relative velocities of the primary material 302 and the layer portion 308. The free surface boundary condition 406 and the drag force 404 model the layer portion 308 as having one or more prescribed velocities.

Then, the motion simulation system 120 (see FIG. 1) may solve the second set of equations for the layer portion 308 to obtain the second velocity field. When the motion simulation system 120 (see FIG. 1) solves the second set of equations, the motion simulation system 120 applies the pressure boundary condition(s) 408 assigned to the second boundary 322 (based on the prescribed dynamics of the outer portion 306), and the solid boundary condition(s) 402 assigned to the first boundary 320. The solid boundary condition(s) 402 exert(s) force on the layer portion 308 (e.g., gas), and not on the primary material 302. This makes sense in view of the fact that water is much heavier than air and easily pushes the air around. Thus, the motion simulation system 120 applies the solid boundary condition(s) 402 to the layer portion 308 (e.g., gas). The layer portion 308 reacts to the solid boundary condition(s) 402 by being pushed around by the primary material 302 (e.g., fluid). The solid boundary condition(s) 402 is based at least in part on the primary material 302. For example, the solid boundary condition(s) 402 may be based at least in part on the first velocity field 504 (see FIG. 5). Thus, in this step, because the primary material 302 significantly influences the layer portion 308 (e.g., because water is much heavier than air), the motion simulation system 120 treats the primary material 302 as a solid boundary with a prescribed velocity (e.g., the first velocity field 504 illustrated in FIG. 5) that was computed when the primary material 302 solved the first set of equations. As mentioned above, the motion simulation system 120 (see FIG. 1) assigns the solid boundary condition(s) 402 (see FIG. 4) to the first boundary 320 (see FIG. 3).

Thus, for each iteration, the motion simulation system 120 (see FIG. 1) solves for the primary material 302, assuming the velocity of the layer portion 308 is prescribed, and solves for the layer portion 308, assuming the velocity of the primary material 302 is prescribed.

Alternating the solves for the primary material 302 and the layer portion 308 is a weaker coupling scheme than the two-phase solver coupling scheme discussed above and may be configured to allow the amount of interaction between the air and the water to be at least partially artist directed. This weaker coupling scheme may achieve believable breakup of the water into wispy patterns but may not preserve the shape of bubbles underwater. Thus, depending upon the implementation details, the drag force exchange 400 may not be suitable for simulating bubbles submerged in a fluid (e.g., water).

As mentioned above, the solid boundary condition(s) 402 applies one or more prescribed velocities to the layer portion 308 (e.g., gas). At the same time, the layer portion 308 (e.g., gas) exerts the drag force 404 on the primary material 302 (e.g., fluid). The drag force 404 may be stored in an adjusted drag force field 502 (see FIG. 5) having a value at each position being simulated (e.g., each position of the Eulerian grid).

The drag force 404 may be determined based at least in part on the material properties of the primary material 302 (e.g., fluid) and a drag force applied by the layer portion 308 to the primary material 302 (and calculated based at least in part on the second velocity field). Examples of such material properties include a velocity property, a position property, and an aeration property. The first velocity field 504 (see FIG. 5) stores values of the velocity property. The velocity values in the first velocity field 504 may be vectors indicating both a direction and rate of motion. Referring to FIG. 5, the motion simulation system 120 may create an aeration field 506. For each position being simulated (e.g., each position of the Eulerian grid), the aeration field 506 may store an aeration value that indicates how aerated the primary material 302 should be at that position. The aeration values may be determined using any method know in the art (e.g., using an aeration heuristic) that measures how aerated the primary material 302 should be at each position being simulated (e.g., each position of the Eulerian grid). Methods of determining the aeration values are known in the art and will not be described herein.

Next, the motion simulation system 120 may create a drag force field 508 (see FIG. 5). For each position being simulated (e.g., each position of the Eulerian grid), the drag force field 508 (see FIG. 5) stores a drag force value (e.g., a vector) that indicates how the layer portion 308 effects the motion (e.g., direction and speed) of the first phase particle, if any, currently in that position. Methods of determining the drag force values are known in the art and will not be described herein. For example, the drag force value may be computed based at least in part on the relative velocities of the primary material 302 and the layer portion 308.

The drag force 404 (see FIG. 4) may be determined as a function of the aeration field 506 and the drag force field 508. As illustrated in FIG. 4 by a dashed line 410, the drag force comes from the secondary material 304 and, as illustrated by a dashed line 412, the aeration property comes from the primary material 302. The motion simulation system 120 may obtain the adjusted drag force field 502 by multiplying each value in the drag force field 508 by the value in the aeration field 506 obtained for the same position.

Then, a new first velocity field 510 may be determined as a function of the adjusted drag force field 502 and the previous first velocity field 504. For example, the motion simulation system 120 may obtain the new first velocity field 510 by multiplying each value in the first velocity field 504 by the value in the adjusted drag force field 502 obtained for the same position. The values in the new first velocity field 510 may be vectors indicating both a direction and rate of motion. The values of the motion parameters 110 may include the new first velocity field 510, which indicates where the first phase particles representing the primary material 302 move and how quickly.

The motion simulation system 120 may calculate new material states for the first phase particles as well as new material states for the second phase representation. The new material states of the first phase particles may include positions and attributes of the first phase particles. The new positions may be based at least in part on the current positions of the first phase particles and the new first velocity field 510. At least some of these new positions may be modified (e.g., by the motion simulation system 120), if necessary, using additional processing known in the art. The new material states of the second phase representation may include states of Eulerian voxels and may be based at least in part on the second velocity field (not shown). The new material states of the first phase particles and the second phase representation may be included in the values of the motion parameters 110.

The motion simulation system 120 may identify new locations for the first and second boundaries 320 and 322 (see FIG. 3) based at least in part on the new material states (e.g., new positions) of the first phase particles. Additionally, the motion simulation system 120 may determine new pressure boundary condition(s) (e.g., an updated hydrostatic pressure field) based at least in part on the new location of the second boundary 322. For example, the motion simulation system 120 may calculate the new pressure boundary condition(s) using Equation 1 above. The values of the motion parameters 110 may include the new locations of the first and second boundaries 320 and 322 (see FIG. 3).

As explained above, referring to FIG. 3, the more aerated the primary material 302 is, the greater the drag force 404 (see FIG. 4) is. Thus, the aeration property may be used to modulate how much drag force is applied to the primary material 302 by the layer portion 308 of the secondary material 304.

Optionally, the values of the first velocity field 504, the aeration field 506, the drag force field 508, and/or the new first velocity field 510 may be modified (e.g., multiplied) by one or more additional values. Examples of such the additional value(s) include density of the primary material 302, artistic or artist-controlled parameters, and/or the like.

In decision block 230, the motion simulation system 120 determines whether the simulation has completed. The decision in decision block 230 is "YES," when the motion simulation system 120 determines the simulation has completed. Otherwise, the decision in decision block 230 is "NO." By way of a non-limiting example, blocks 220-235 may be repeated a desired number of iterations (e.g., five times). The number of iterations might be specified by an artist (e.g., the artist 142) or operator in advance. For example, blocks 220-235 may be repeated a number of times required to generate the values of the motion parameters 110 needed to create a desired number of frames.

When the decision in decision block 230 is "NO," the motion simulation system 120 advances to block 235 whereat the motion simulation system 120 advances the simulation in time. Then, the motion simulation system 120 returns to block 220 and assigns new boundary condition(s) to the first and second boundaries 320 and 322.

When the decision in decision block 230 is "YES," in block 240, the motion simulation system 120 forwards the values of the motion parameters 110 to the animation creation system 630 (see FIGS. 1 and 6) component of the visual content generation system 600 (see FIG. 6), which uses the values of the motion parameters 110 to create visual representations of a waterfall including the first material 112 and/or the second material 114. Then, the process 200 terminates.

Figure 6:
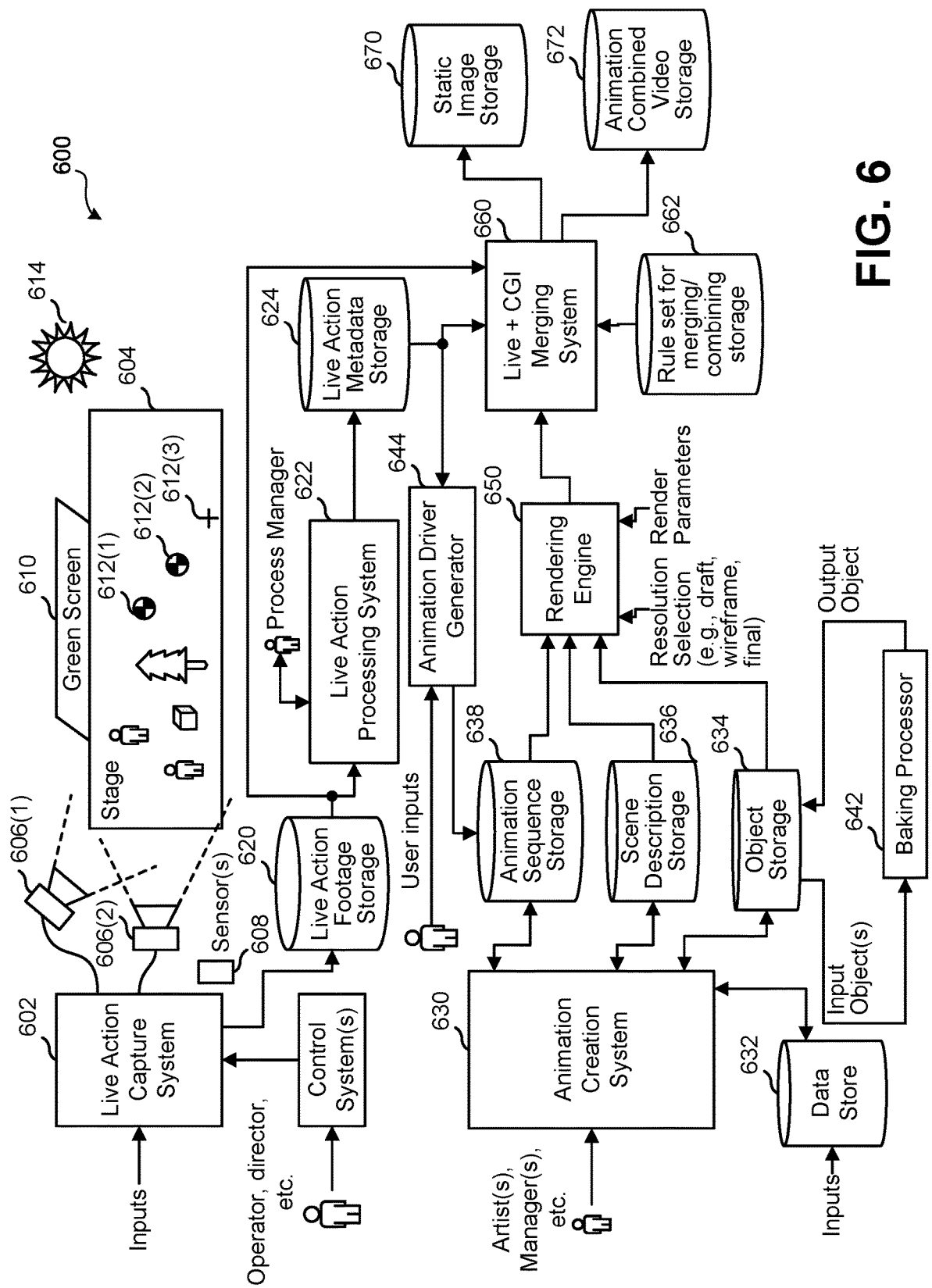
FIG. 6 illustrates an example visual content generation system as might be used to generate imagery in the form of still images and/or video sequences of images, according to various embodiments.

For example, FIG. 6 illustrates the example visual content generation system 600 as might be used to generate imagery in the form of still images and/or video sequences of images. Visual content generation system 600 might generate imagery of live action scenes, computer generated scenes, or a combination thereof. In a practical system, users are provided with tools that allow them to specify, at high levels and low levels where necessary, what is to go into that imagery. For example, a user might be an animation artist (like artist 142 illustrated in FIG. 1) and might use visual content generation system 600 to capture interaction between two human actors performing live on a sound stage and replace one of the human actors with a computer-generated anthropomorphic non-human being that behaves in ways that mimic the replaced human actor's movements and mannerisms, and then add in a third computer-generated character and background scene elements that are computer-generated, all in order to tell a desired story or generate desired imagery.

Still images that are output by visual content generation system 600 might be represented in computer memory as pixel arrays, such as a two-dimensional array of pixel color values, each associated with a pixel having a position in a two-dimensional image array. Pixel color values might be represented by three or more (or fewer) color values per pixel, such as a red value, a green value, and a blue value (e.g., in RGB format). Dimensions of such a two-dimensional array of pixel color values might correspond to a preferred and/or standard display scheme, such as 1920-pixel columns by 1280-pixel rows or 4096-pixel columns by 2160-pixel rows, or some other resolution. Images might or might not be stored in a compressed format, but either way, a desired image may be represented as a two-dimensional array of pixel color values. In another variation, images are represented by a pair of stereo images for three-dimensional presentations and in other variations, an image output, or a portion thereof, might represent three-dimensional imagery instead of just two-dimensional views. In yet other embodiments, pixel values are data structures and a pixel value is associated with a pixel and can be a scalar value, a vector, or another data structure associated with a corresponding pixel. That pixel value might include color values, or not, and might include depth values, alpha values, weight values, object identifiers or other pixel value components.

A stored video sequence might include a plurality of images such as the still images described above, but where each image of the plurality of images has a place in a timing sequence and the stored video sequence is arranged so that when each image is displayed in order, at a time indicated by the timing sequence, the display presents what appears to be moving and/or changing imagery. In one representation, each image of the plurality of images is a video frame having a specified frame number that corresponds to an amount of time that would elapse from when a video sequence begins playing until that specified frame is displayed. A frame rate might be used to describe how many frames of the stored video sequence are displayed per unit time. Example video sequences might include 24 frames per second (24 FPS), 50 FPS, 140 FPS, or other frame rates. In some embodiments, frames are interlaced or otherwise presented for display, but for clarity of description, in some examples, it is assumed that a video frame has one specified display time, but other variations might be contemplated.

One method of creating a video sequence is to simply use a video camera to record a live action scene, i.e., events that physically occur and can be recorded by a video camera. The events being recorded can be events to be interpreted as viewed (such as seeing two human actors talk to each other) and/or can include events to be interpreted differently due to clever camera operations (such as moving actors about a stage to make one appear larger than the other despite the actors actually being of similar build, or using miniature objects with other miniature objects so as to be interpreted as a scene containing life-sized objects).

Creating video sequences for story-telling or other purposes often calls for scenes that cannot be created with live actors, such as a talking tree, an anthropomorphic object, space battles, and the like. Such video sequences might be generated computationally rather than capturing light from live scenes. In some instances, an entirety of a video sequence might be generated computationally, as in the case of a computer-animated feature film. In some video sequences, it is desirable to have some computer-generated imagery and some live action, perhaps with some careful merging of the two.

While computer-generated imagery might be creatable by manually specifying each color value for each pixel in each frame, this is likely too tedious to be practical. As a result, a creator uses various tools to specify the imagery at a higher level. As an example, an artist (e.g., artist 142 illustrated in FIG. 1) might specify the positions in a scene space, such as a three-dimensional coordinate system, of objects and/or lighting, as well as a camera viewpoint, and a camera view plane. From that, a rendering engine could take all of those as inputs, and compute each of the pixel color values in each of the frames. In another example, an artist specifies position and movement of an articulated object having some specified texture rather than specifying the color of each pixel representing that articulated object in each frame.

In a specific example, a rendering engine performs ray tracing wherein a pixel color value is determined by computing which objects lie along a ray traced in the scene space from the camera viewpoint through a point or portion of the camera view plane that corresponds to that pixel. For example, a camera view plane might be represented as a rectangle having a position in the scene space that is divided into a grid corresponding to the pixels of the ultimate image to be generated, and if a ray defined by the camera viewpoint in the scene space and a given pixel in that grid first intersects a solid, opaque, blue object, that given pixel is assigned the color blue. Of course, for modern computer-generated imagery, determining pixel colors—and thereby generating imagery—can be more complicated, as there are lighting issues, reflections, interpolations, and other considerations.

As illustrated in FIG. 6, a live action capture system 602 captures a live scene that plays out on a stage 604. Live action capture system 602 is described herein in greater detail, but might include computer processing capabilities, image processing capabilities, one or more processors, program code storage for storing program instructions executable by the one or more processors, as well as user input devices and user output devices, not all of which are shown.

In a specific live action capture system, cameras 606(1) and 606(2) capture the scene, while in some systems, there might be other sensor(s) 608 that capture information from the live scene (e.g., infrared cameras, infrared sensors, motion capture ("mo-cap") detectors, etc.). On stage 604, there might be human actors, animal actors, inanimate objects, background objects, and possibly an object such as a green screen 610 that is designed to be captured in a live scene recording in such a way that it is easily overlaid with computer-generated imagery. Stage 604 might also contain objects that serve as fiducials, such as fiducials 612(1)-(3), that might be used post-capture to determine where an object was during capture. A live action scene might be illuminated by one or more lights, such as an overhead light 614.

During or following the capture of a live action scene, live action capture system 602 might output live action footage to a live action footage storage 620. A live action processing system 622 might process live action footage to generate data about that live action footage and store that data into a live action metadata storage 624. Live action processing system 622 might include computer processing capabilities, image processing capabilities, one or more processors, program code storage for storing program instructions executable by the one or more processors, as well as user input devices and user output devices, not all of which are shown. Live action processing system 622 might process live action footage to determine boundaries of objects in a frame or multiple frames, determine locations of objects in a live action scene, where a camera was relative to some action, distances between moving objects and fiducials, etc. Where elements have sensors attached to them or are detected, the metadata might include location, color, and intensity of overhead light 614, as that might be useful in post-processing to match computer-generated lighting on objects that are computer-generated and overlaid on the live action footage. Live action processing system 622 might operate autonomously, perhaps based on predetermined program instructions, to generate and output the live action metadata upon receiving and inputting the live action footage. The live action footage can be camera-captured data as well as data from other sensors.

An animation creation system 630 is another part of visual content generation system 600. Animation creation system 630 might include computer processing capabilities, image processing capabilities, one or more processors, program code storage for storing program instructions executable by the one or more processors, as well as user input devices and user output devices, not all of which are shown. Animation creation system 630 might be used by animation artists, managers, and others to specify details, perhaps programmatically and/or interactively, of imagery to be generated. From user input and data from a database or other data source, indicated as a data store 632, animation creation system 630 might generate and output data representing objects (e.g., a horse, a human, a ball, a teapot, a cloud, a light source, a texture, etc.) to an object storage 634, generate and output data representing a scene into a scene description storage 636, and/or generate and output data representing animation sequences to an animation sequence storage 638.

Scene data might indicate locations of objects and other visual elements, values of their parameters, lighting, camera location, camera view plane, and other details that a rendering engine 650 might use to render CGI imagery. For example, scene data might include the locations of several articulated characters, background objects, lighting, etc. specified in a two-dimensional space, three-dimensional space, or other dimensional space (such as a 2.5-dimensional space, three-quarter dimensions, pseudo-3D spaces, etc.) along with locations of a camera viewpoint and view place from which to render imagery. For example, scene data might indicate that there is to be a red, fuzzy, talking dog in the right half of a video and a stationary tree in the left half of the video, all illuminated by a bright point light source that is above and behind the camera viewpoint. In some cases, the camera viewpoint is not explicit, but can be determined from a viewing frustum. In the case of imagery that is to be rendered to a rectangular view, the frustum would be a truncated pyramid. Other shapes for a rendered view are possible and the camera view plane could be different for different shapes.

Animation creation system 630 might be interactive, allowing a user to read in animation sequences, scene descriptions, object details, etc. and edit those, possibly returning them to storage to update or replace existing data. As an example, an operator might read in objects from object storage into a baking processor 642 that would transform those objects into simpler forms and return those to object storage 634 as new or different objects. For example, an operator might read in an object that has dozens of specified parameters (movable joints, color options, textures, etc.), select some values for those parameters and then save a baked object that is a simplified object with now fixed values for those parameters.

Rather than requiring user specification of each detail of a scene, data from data store 632 might be used to drive object presentation. For example, if an artist is creating an animation of a spaceship passing over the surface of the Earth, instead of manually drawing or specifying a coastline, the artist might specify that animation creation system 630 is to read data from data store 632 in a file containing coordinates of Earth coastlines and generate background elements of a scene using that coastline data.

Animation sequence data might be in the form of time series of data for control points of an object that has attributes that are controllable. For example, an object might be a humanoid character with limbs and joints that are movable in manners similar to typical human movements. An artist can specify an animation sequence at a high level, such as "the left hand moves from location (X1, Y1, Z1) to (X2, Y2, Z2) over time T1 to T2", at a lower level (e.g., "move the elbow joint 2.5 degrees per frame") or even at a very high level (e.g., "character A should move, consistent with the laws of physics that are given for this scene, from point P1 to point P2 along a specified path").

Animation sequences in an animated scene might be specified by what happens in a live action scene. An animation driver generator 644 might read in live action metadata, such as data representing movements and positions of body parts of a live actor during a live action scene. Animation driver generator 644 might generate corresponding animation parameters to be stored in animation sequence storage 638 for use in animating a CGI object. This can be useful where a live action scene of a human actor is captured while wearing mo-cap fiducials (e.g., high-contrast markers outside actor clothing, high-visibility paint on actor skin, face, etc.) and the movement of those fiducials is determined by live action processing system 622. Animation driver generator 644 might convert that movement data into specifications of how joints of an articulated CGI character are to move over time.

A rendering engine 650 can read in animation sequences, scene descriptions, and object details, as well as rendering engine control inputs, such as a resolution selection and a set of rendering parameters. Resolution selection might be useful for an operator to control a trade-off between speed of rendering and clarity of detail, as speed might be more important than clarity for a movie maker to test some interaction or direction, while clarity might be more important than speed for a movie maker to generate data that will be used for final prints of feature films to be distributed. Rendering engine 650 might include computer processing capabilities, image processing capabilities, one or more processors, program code storage for storing program instructions executable by the one or more processors, as well as user input devices and user output devices, not all of which are shown.

Visual content generation system 600 can also include a merging system 660 that merges live footage with animated content. The live footage might be obtained and input by reading from live action footage storage 620 to obtain live action footage, by reading from live action metadata storage 624 to obtain details such as presumed segmentation in captured images segmenting objects in a live action scene from their background (perhaps aided by the fact that green screen 610 was part of the live action scene), and by obtaining CGI imagery from rendering engine 650.

A merging system 660 might also read data from rulesets for merging/combining storage 662. A very simple example of a rule in a ruleset might be "obtain a full image including a two-dimensional pixel array from live footage, obtain a full image including a two-dimensional pixel array from rendering engine 650, and output an image where each pixel is a corresponding pixel from rendering engine 650 when the corresponding pixel in the live footage is a specific color of green, otherwise output a pixel value from the corresponding pixel in the live footage."

Merging system 660 might include computer processing capabilities, image processing capabilities, one or more processors, program code storage for storing program instructions executable by the one or more processors, as well as user input devices and user output devices, not all of which are shown. Merging system 660 might operate autonomously, following programming instructions, or might have a user interface or programmatic interface over which an operator can control a merging process. In some embodiments, an operator can specify parameter values to use in a merging process and/or might specify specific tweaks to be made to an output of merging system 660, such as modifying boundaries of segmented objects, inserting blurs to smooth out imperfections, or adding other effects. Based on its inputs, merging system 660 can output an image to be stored in a static image storage 670 and/or a sequence of images in the form of video to be stored in an animated/combined video storage 672.

Thus, as described, visual content generation system 600 can be used to generate video that combines live action with computer-generated animation using various components and tools, some of which are described in more detail herein. While visual content generation system 600 might be useful for such combinations, with suitable settings, it can be used for outputting entirely live action footage or entirely CGI sequences. The code may also be provided and/or carried by a transitory computer readable medium, e.g., a transmission medium such as in the form of a signal transmitted over a network.

According to one embodiment, the techniques described herein are implemented by one or more generalized computing systems programmed to perform the techniques pursuant to program instructions in firmware, memory, other storage, or a combination. Special-purpose computing devices may be used, such as desktop computer systems, portable computer systems, handheld devices, networking devices or any other device that incorporates hard-wired and/or program logic to implement the techniques.

Figure 7:
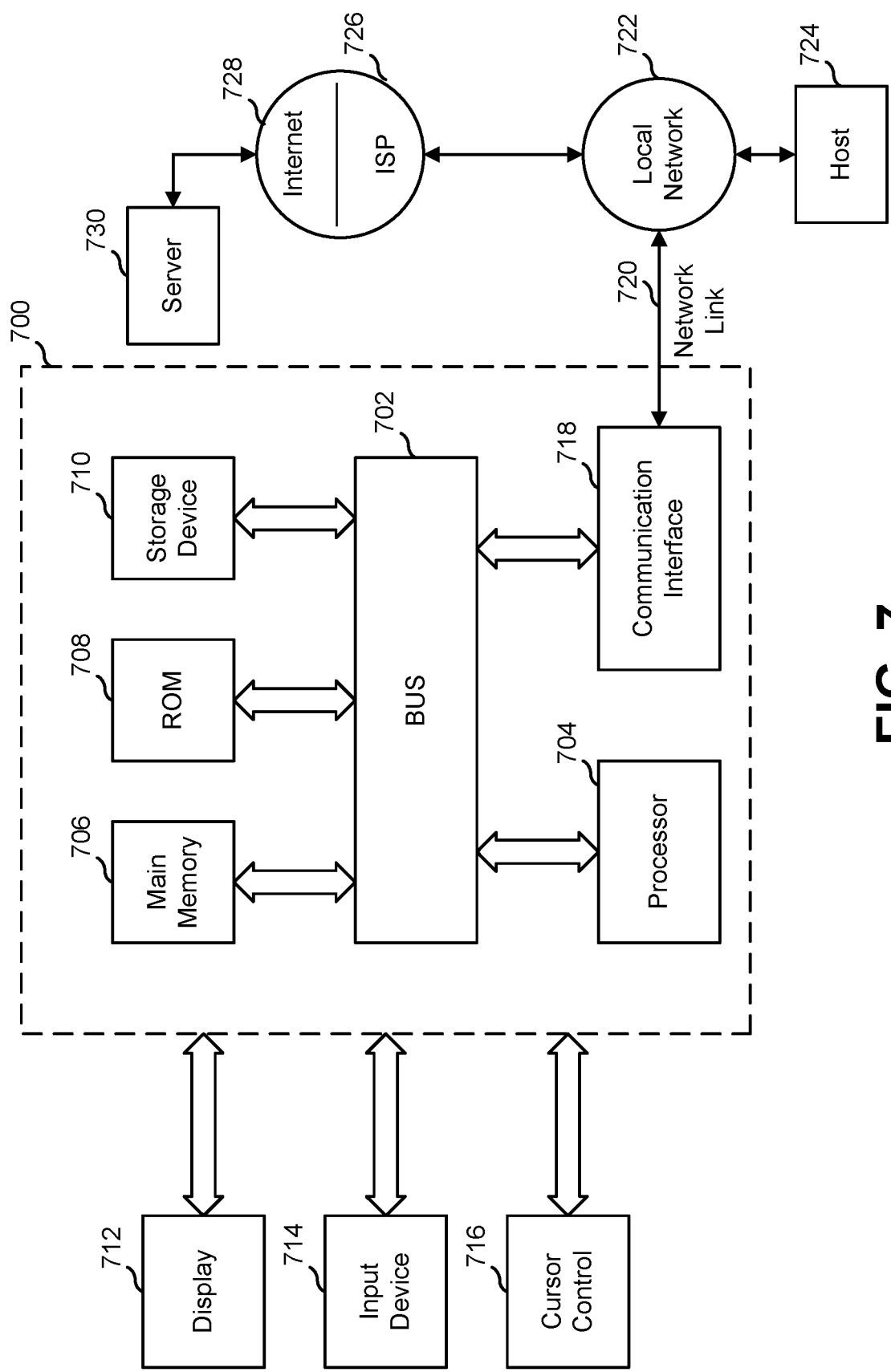
FIG. 7 is a block diagram illustrating an example computer system upon which computer systems of the systems illustrated in FIGS. 1 and 6 may be implemented.

For example, FIG. 7 is a block diagram that illustrates a computer system 700 upon which the computer systems of the systems described herein and/or visual content generation system 600 (see FIG. 6) may be implemented. Computer system 700 includes a bus 702 or other communication mechanism for communicating information, and a processor 704 coupled with bus 702 for processing information. Processor 704 may be, for example, a general-purpose microprocessor.

Computer system 700 also includes a main memory 706, such as a random-access memory (RAM) or other dynamic storage device, coupled to bus 702 for storing information and instructions to be executed by processor 704. Main memory 706 may also be used for storing temporary variables or other intermediate information during execution of instructions to be executed by processor 704. Such instructions, when stored in non-transitory storage media accessible to processor 704, render computer system 700 into a special-purpose machine that is customized to perform the operations specified in the instructions.

Computer system 700 further includes a read only memory (ROM) 708 or other static storage device coupled to bus 702 for storing static information and instructions for processor 704. A storage device 710, such as a magnetic disk or optical disk, is provided and coupled to bus 702 for storing information and instructions.

Computer system 700 may be coupled via bus 702 to a display 712, such as a computer monitor, for displaying information to a computer user. An input device 714, including alphanumeric and other keys, is coupled to bus 702 for communicating information and command selections to processor 704. Another type of user input device is a cursor control 716, such as a mouse, a trackball, or cursor direction keys for communicating direction information and command selections to processor 704 and for controlling cursor movement on display 712. This input device typically has two degrees of freedom in two axes, a first axis (e.g., x) and a second axis (e.g., y), that allows the device to specify positions in a plane.

Computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor 704 executing one or more sequences of one or more instructions contained in main memory 706. Such instructions may be read into main memory 706 from another storage medium, such as storage device 710. Execution of the sequences of instructions contained in main memory 706 causes processor 704 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may include non-volatile media and/or volatile media. Non-volatile media includes, for example, optical or magnetic disks, such as storage device 710. Volatile media includes dynamic memory, such as main memory 706. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, an EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire, and fiber optics, including the wires that include bus 702. Transmission media can also take the form of acoustic or light waves, such as those generated during radio-wave and infra-red data communications.

Various forms of media may be involved in carrying one or more sequences of one or more instructions to processor 704 for execution. For example, the instructions may initially be carried on a magnetic disk or solid-state drive of a remote computer. The remote computer can load the instructions into its dynamic memory and send the instructions over a network connection. A modem or network interface local to computer system 700 can receive the data. Bus 702 carries the data to main memory 706, from which processor 704 retrieves and executes the instructions. The instructions received by main memory 706 may optionally be stored on storage device 710 either before or after execution by processor 704.

Computer system 700 also includes a communication interface 718 coupled to bus 702. Communication interface 718 provides a two-way data communication coupling to a network link 720 that is connected to a local network 722. For example, communication interface 718 may be a network card, a modem, a cable modem, or a satellite modem to provide a data communication connection to a corresponding type of telephone line or communications line. Wireless links may also be implemented. In any such implementation, communication interface 718 sends and receives electrical, electromagnetic, or optical signals that carry digital data streams representing various types of information.

Network link 720 typically provides data communication through one or more networks to other data devices. For example, network link 720 may provide a connection through local network 722 to a host computer 724 or to data equipment operated by an Internet Service Provider (ISP) 726. ISP 726 in turn provides data communication services through the world-wide packet data communication network now commonly referred to as the "Internet" 728. Local network 722 and Internet 728 both use electrical, electromagnetic, or optical signals that carry digital data streams. The signals through the various networks and the signals on network link 720 and through communication interface 718, which carry the digital data to and from computer system 700, are example forms of transmission media.

Computer system 700 can send messages and receive data, including program code, through the network(s), network link 720, and communication interface 718. In the Internet example, a server 730 might transmit a requested code for an application program through the Internet 728, ISP 726, local network 722, and communication interface 718. The received code may be executed by processor 704 as it is received, and/or stored in storage device 710, or other non-volatile storage for later execution.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. The code may also be provided carried by a transitory computer readable medium e.g., a transmission medium such as in the form of a signal transmitted over a network.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

The use of examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

Further embodiments can be envisioned to one of ordinary skill in the art after reading this disclosure. In other embodiments, combinations or sub-combinations of the above-disclosed invention can be advantageously made. The example arrangements of components are shown for purposes of illustration and combinations, additions, re-arrangements, and the like are contemplated in alternative embodiments of the present invention. Thus, while the invention has been described with respect to exemplary embodiments, one skilled in the art will recognize that numerous modifications are possible.

For example, the processes described herein may be implemented using hardware components, software components, and/or any combination thereof. The specification and drawings are, accordingly, to be regarded in an illustrative rather than a restrictive sense. It will, however, be evident that various modifications and changes may be made thereunto without departing from the broader spirit and scope of the invention as set forth in the claims and that the invention is intended to cover all modifications and equivalents within the scope of the following claims.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method for simulating interactions between two different materials, the computer-implemented method comprising:
   under the control of one or more computer systems configured with executable instructions:
   modeling a primary material as a plurality of objects;
   modeling a secondary material as a grid-based fluid volume completely surrounding the plurality of objects, the fluid volume comprising a layer portion and an outer portion, the layer portion being positioned between the plurality of objects and the outer portion;
   assigning at least one boundary condition to a boundary positioned between the layer portion and the outer portion based at least in part on pressures of the outer portion and configured to affect the layer portion, wherein the at least one boundary condition comprises a pressure boundary condition;
   determining values of motion parameters for the primary material based on the plurality of objects and the layer portion; and
   determining values of motion parameters for the secondary material based on the plurality of objects, the layer portion, the at least one boundary condition, independent of the outer portion.

2. The computer-implemented method of claim 1, wherein the layer portion has a predefined thickness.

3. The computer-implemented method of claim 1, wherein the layer portion has a thickness that depends on a difference in densities between the primary material and the secondary material.

4. The computer-implemented method of claim 1, wherein motion of the objects of the plurality of objects with respect to one another is constrained in zero, one, two, or three degrees of freedom.

5. The computer-implemented method of claim 1, wherein a sparse modeling of the outer portion of the secondary material is used to compute the one or more boundary conditions.

6. The computer-implemented method of claim 1, wherein the at least one boundary condition includes a velocity at the boundary configured to affect the layer portion.

7. The computer-implemented method of claim 6, wherein the at least one boundary condition includes a two-phase Eulerian Navier-Stokes approach that allows a pressure jump between the primary material and secondary material, and wherein the at least one boundary condition includes velocity continuity conditions at the boundary.

8. The computer-implemented method of claim 1, wherein the at least one boundary condition allows for coupling between the layer portion and the primary material.

9. The computer-implemented method of claim 1, further comprising:
   calculating an aeration field for the primary material; and
   calculating a drag force field for the secondary material, wherein the primary velocity field, the aeration field, and the drag force field are used for calculating a new primary velocity field for the primary material.

10. The computer-implemented method of claim 1, wherein the boundary is a second boundary, and the at least one boundary condition is at least one second boundary condition, the method further comprising:
    assigning at least one first boundary condition to a first boundary positioned between the primary material and the layer portion, the at least one first boundary condition comprising a free surface boundary condition.

11. The computer-implemented method of claim 10, wherein the at least one first boundary condition comprises a drag force in a vicinity of the first boundary.

12. The computer-implemented method of claim 10, wherein the at least one first boundary condition comprises a solid boundary condition applied at the second boundary and the at least one primary boundary condition comprises a pressure boundary condition applied at the first boundary.

13. The computer-implemented method of claim 1, further comprising:
    calculating a primary velocity field for the primary material, wherein the primary velocity field is configured to store a primary velocity value that indicates how an environment affects motion of the plurality of objects.

14. The computer-implemented method of claim 13, further comprising:
    calculating a secondary velocity field for the secondary material, wherein the secondary velocity field is configured to store a secondary velocity value that indicates how the environment affects motion of a portion of the secondary material.

15. The computer-implemented method of claim 1, wherein the primary material comprises air and the plurality of objects comprises a plurality of bubbles, and wherein the secondary material comprises water.

16. The computer-implemented method of claim 1, wherein the primary material comprises one of a polar fluid or a non-polar fluid, and the secondary material comprises the other of a polar fluid or a non-polar fluid.

17. A non-transitory computer-readable storage medium storing instructions, which when executed by at least one processor of a computer system, cause the computer system to carry out the method of claim 1.

18. A computer-readable medium carrying instructions, which when executed by at least one processor of a computer system, cause the computer system to carry out the method of claim 1.

19. The computer-implemented method of claim 1, further comprising generating one or more visual representations of the primary material interacting with the secondary material based on the values of the motion parameters.

20. The computer-implemented method of claim 17, wherein either the primary material or the secondary material is invisible in the one or more visual representations.

* * * * *